United States Patent
Bian et al.

(10) Patent No.: US 8,546,888 B2
(45) Date of Patent: Oct. 1, 2013

(54) ISOLATION REGIONS

(75) Inventors: Zailong Bian, Manassas, VA (US); Xiaolong Fang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/164,085

(22) Filed: Jun. 20, 2011

(65) Prior Publication Data

US 2011/0241096 A1  Oct. 6, 2011

Related U.S. Application Data

(62) Division of application No. 11/486,691, filed on Jul. 14, 2006, now Pat. No. 7,968,425.

(51) Int. Cl.
*H01L 21/70* (2006.01)

(52) U.S. Cl.
USPC .... 257/374; 257/390; 257/506; 257/E27.076; 257/E27.084; 257/E27.098; 257/E29.02

(58) Field of Classification Search
USPC ............ 257/374, 390, 506, E27.076, E27.84, 257/E27.098, E27.102, E29.02
See application file for complete search history.

(56) References Cited

U.S. PATENT DOCUMENTS

| | | | |
|---|---|---|---|
| 5,518,950 A | 5/1996 | Ibok et al. | |
| 6,211,040 B1 | 4/2001 | Liu et al. | |
| 6,333,218 B1 | 12/2001 | Ngo et al. | |
| 6,399,461 B1 | 6/2002 | Liu et al. | |
| 6,479,405 B2 | 11/2002 | Lee et al. | |
| 6,613,631 B2* | 9/2003 | Koishikawa | 438/258 |
| 7,118,987 B2 | 10/2006 | Fu et al. | |
| 7,160,787 B2 | 1/2007 | Heo et al. | |
| 7,179,717 B2 | 2/2007 | Sandhu et al. | |
| 7,332,409 B2 | 2/2008 | Cha et al. | |
| 7,563,690 B2 | 7/2009 | Yang | |
| 2005/0186755 A1 | 8/2005 | Smythe, III et al. | |
| 2005/0258463 A1* | 11/2005 | Yaegashi et al. | 257/296 |
| 2005/0285179 A1 | 12/2005 | Violette | |
| 2005/0287731 A1 | 12/2005 | Bian et al. | |
| 2006/0094203 A1* | 5/2006 | Choi et al. | 438/424 |

* cited by examiner

*Primary Examiner* — Charles Garber
*Assistant Examiner* — Ron Pompey
(74) *Attorney, Agent, or Firm* — Leffert Jay & Polglaze, P.A.

(57) ABSTRACT

Methods and apparatus are provided. An isolation region is formed by lining a trench formed in a substrate with a first dielectric layer by forming the first dielectric layer adjoining exposed substrate surfaces within the trench using a high-density plasma process, forming a layer of spin-on dielectric material on the first dielectric layer so as to fill a remaining portion of the trench, and densifying the layer of spin-on dielectric material.

23 Claims, 9 Drawing Sheets

ISOLATION REGIONS

RELATED APPLICATION

This is a divisional application of application Ser. No. 11/486,691, titled "ISOLATION REGIONS," filed on Jul. 14, 2006 and issued as U.S. Pat. No. 7,968,425 on Jun. 28, 2011, which application is assigned to the assignee of the present invention and the entire contents of which are incorporated herein by reference.

FIELD

The present invention relates generally to isolation in integrated circuit devices and in particular the present invention relates to isolation regions.

BACKGROUND

Integrated circuit devices are typically formed on semiconductor substrates using semiconductor fabrication methods. Isolation trenches are often formed in a substrate and filled with a dielectric, e.g., shallow trench isolation (STI), to provide electrical isolation between components of an integrated circuit device. The isolation trenches are often filled using a chemical vapor deposition process, e.g., with high-density plasma (HDP) oxides. However, in the quest for smaller integrated circuit devices, spacing requirements between components often require the isolation trenches to have relatively narrow widths, resulting in large aspect (or trench-depth-to-trench-width) ratios. The large aspect ratios often cause voids to form within the dielectric while filling these trenches.

Memory device fabrication is an example where problems exist with filling large-aspect-ratio isolation trenches. In general, memory devices contain an array of memory cells for storing data, and row and column decoder circuits coupled to the array of memory cells for accessing the array of memory cells in response to an external address. During fabrication, the isolation trenches are formed between successive columns of memory cells of the array and are filled with dielectrics to electrically isolate the columns from each other. As memory devices continue to become smaller in size, the spacing between the columns is reduced and thus exacerbates the problems of void formation.

For the reasons stated above, and for other reasons stated below which will become apparent to those skilled in the art upon reading and understanding the present specification, there is a need in the art for alternative trench filling processes.

DETAILED DESCRIPTION

Figure 1:
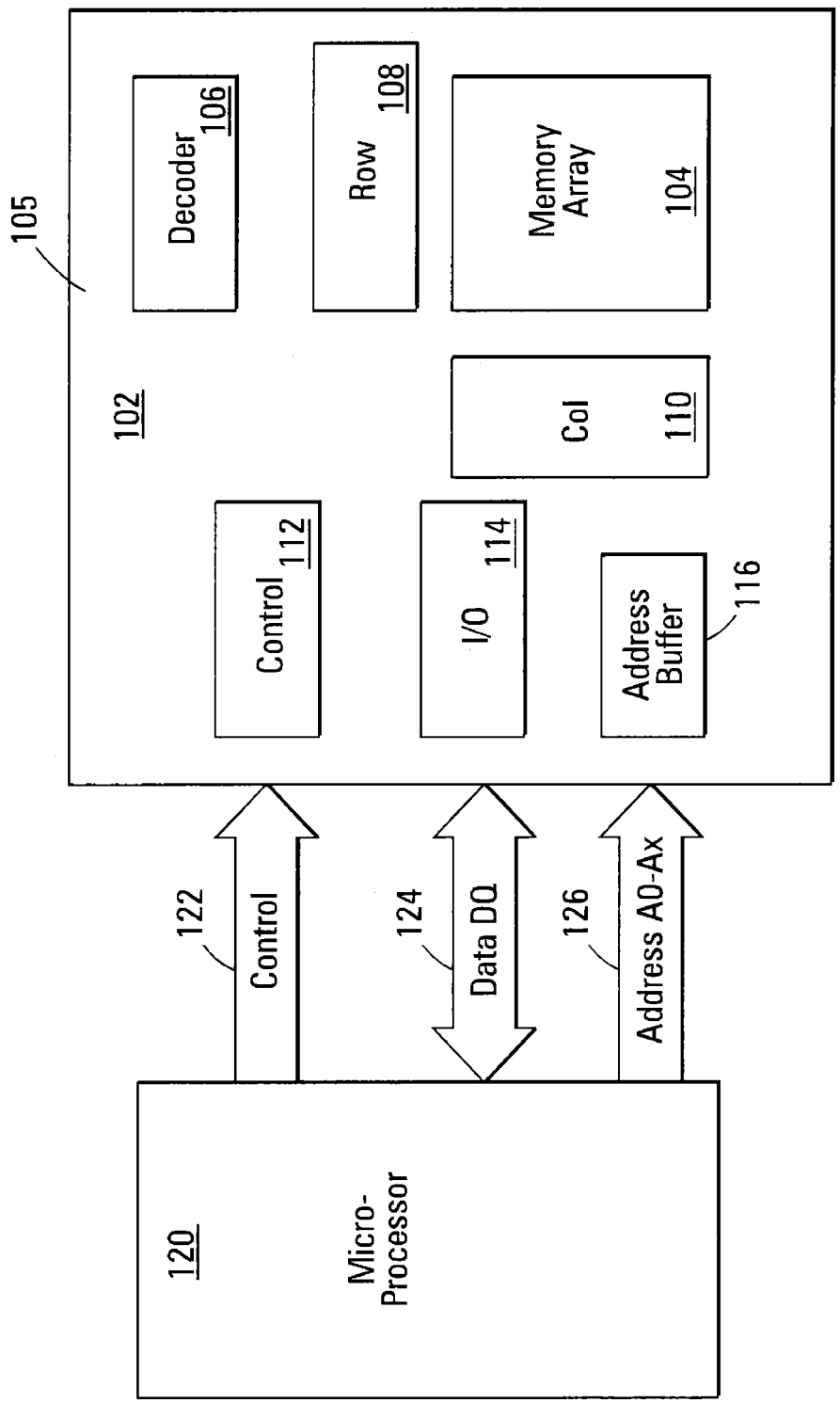
FIG. 1 is a block diagram illustration of an integrated circuit device, according to an embodiment of the invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The term wafer or substrate used in the following description includes any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

FIG. 1 is a block diagram illustration of an integrated circuit device, such as a processor, a memory device 102, etc., according to an embodiment of the invention. The memory device 102 may be fabricated as semiconductor device on a semiconductor substrate. Examples of memory devices include NAND, NOR, or NROM flash memory devices, dynamic random access memory devices (DRAMs), static random access memory devices (SRAMs), or the like.

For one embodiment, memory device 102 includes an array of flash memory cells 104 and a region 105 peripheral to memory array 104 that includes an address decoder 106, row access circuitry 108, column access circuitry 110, control circuitry 112, Input/Output (I/O) circuitry 114, and an address buffer 116. The row access circuitry 108 and column access circuitry 110 may include high-voltage circuitry, such as high-voltage pumps. The device of FIG. 1 includes isolation regions formed in accordance with an embodiment of the invention, e.g., between region 105 and memory 104 as well as within memory array 104.

Memory device 100 may be coupled an external microprocessor 120, or memory controller, for memory accessing as part of an electronic system. The memory device 102 receives control signals from the processor 120 over a control link 122. The memory cells are used to store data that are accessed via a data (DQ) link 124. Address signals are received via an address link 126 that are decoded at address decoder 106 to access the memory array 104. Address buffer circuit 116 latches the address signals. The memory cells are accessed in response to the control signals and the address signals. It will be appreciated by those skilled in the art that additional circuitry and control signals can be provided, and that the memory device of FIG. 1 has been simplified to help focus on the invention.

The memory array 104 includes memory cells arranged in row and column fashion. For one embodiment, each of the memory cells includes a floating-gate field-effect transistor capable of holding a charge. The cells may be grouped into blocks. Each of the cells within a block can be electrically programmed on an individual basis by charging the floating gate. The charge can be removed from the floating gate by a block erase operation.

Figure 2:
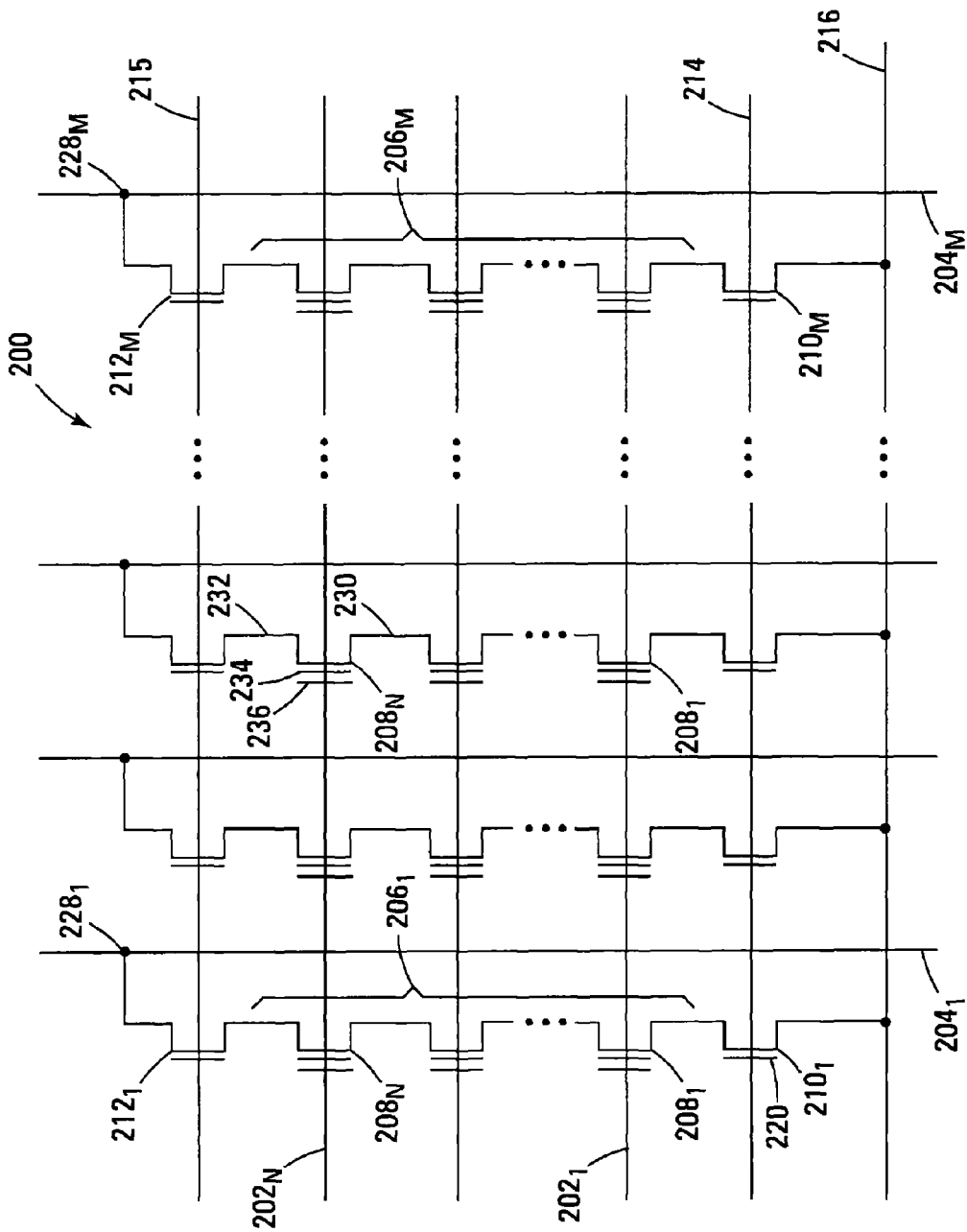
FIG. 2 is a schematic of a NAND memory array in accordance with another embodiment of the invention.

FIG. 2 is a schematic of a NAND memory array 200 as a portion of memory array 104 of FIG. 1 in accordance with another embodiment of the invention. As shown in FIG. 2, the memory array 200 includes word lines $202_1$ to $202_N$ and intersecting local bit lines $204_1$ to $204_M$. For ease of addressing in the digital environment, the number of word lines 202 and the number of bit lines 204 are each some power of two, e.g., 256 word lines 202 by 4,096 bit lines 204. The local bit lines 204 are coupled to global bit lines (not shown) in a many-to-one relationship.

Memory array 200 includes NAND strings $206_1$ to $206_M$. Each NAND string includes floating-gate transistors $208_1$ to $208_N$, each located at an intersection of a word line 202 and a local bit line 204. The floating-gate transistors 208 represent non-volatile memory cells for storage of data. The floating-gate transistors 208 of each NAND string 206 are connected in series, source to drain, between a source select gate 210, e.g., a field-effect transistor (FET), and a drain select gate 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. A control gate 220 of each source select gate 210 is connected to source select line 214.

The drain of each drain select gate 212 is connected to a local bit line 204 for the corresponding NAND string at a drain contact 228. For example, the drain of drain select gate $212_1$ is connected to the local bit line $204_1$ for the corresponding NAND string $206_1$ at drain contact $228_1$. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of the floating-gate transistors 208 are those NAND strings 206 coupled to a given local bit line 204. A row of the floating-gate transistors 208 are those transistors commonly coupled to a given word line 202. Memory array 200 includes isolation regions formed in accordance with embodiments of the invention, e.g., between columns of memory array 200.

Figure 3:
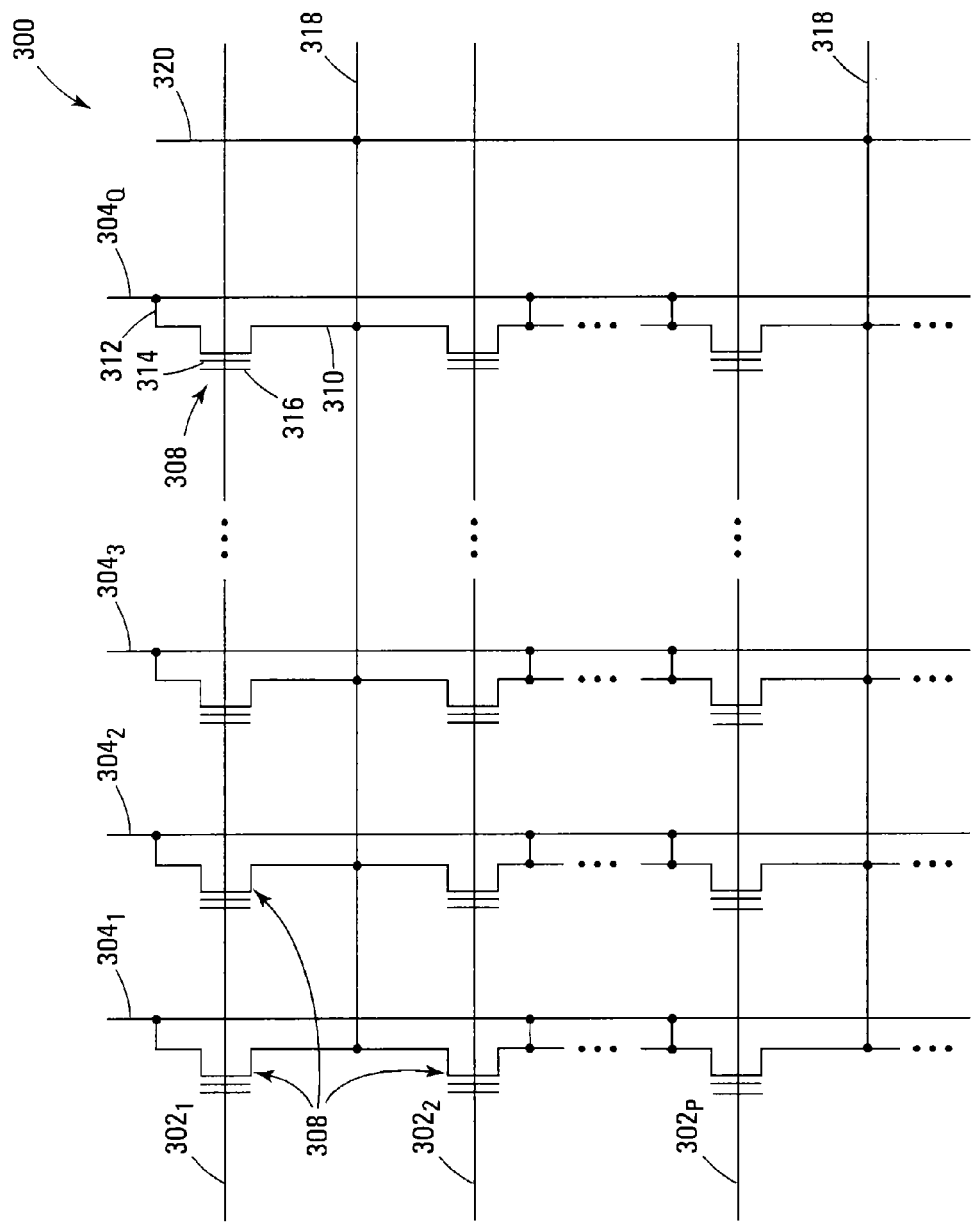
FIG. 3 is a schematic of a NOR memory array in accordance with another embodiment of the invention.

FIG. 3 is a schematic of a NOR memory array 300 as a portion of memory array 104 of FIG. 1 in accordance with another embodiment of the invention. Memory array 300 includes word lines $302_1$ to $302_P$ and intersecting local bit lines $304_1$ to $304_Q$. For ease of addressing in the digital environment, the number of word lines 302 and the number of bit lines 304 are each some power of two, e.g., 256 word lines 302 by 4,096 bit lines 304. The local bit lines 304 are coupled to global bit lines (not shown) in a many-to-one relationship.

Floating-gate transistors 308 are located at each intersection of a word line 302 and a local bit line 304. The floating-gate transistors 308 represent non-volatile memory cells for storage of data. Typical construction of such floating-gate transistors 308 includes a source 310 and a drain 312, a floating gate 314, and a control gate 316.

Floating-gate transistors 308 having their control gates 316 coupled to a word line 302 typically share a common source depicted as array source 318. As shown in FIG. 3, floating-gate transistors 308 coupled to two adjacent word lines 302 may share the same array source 318. Floating-gate transistors 308 have their drains 312 coupled to a local bit line 304. A column of the floating-gate transistors 308 includes those transistors commonly coupled to a given local bit line 304. A row of the floating-gate transistors 308 includes those transistors commonly coupled to a given word line 302. Memory array 300 includes isolation regions formed in accordance with embodiments of the invention, e.g., between columns of memory array 300.

To reduce problems associated with high resistance levels in the array source 318, the array source 318 is regularly coupled to a metal or other highly conductive line to provide a low-resistance path to ground. The array ground 320 serves as this low-resistance path.

Figure 4:
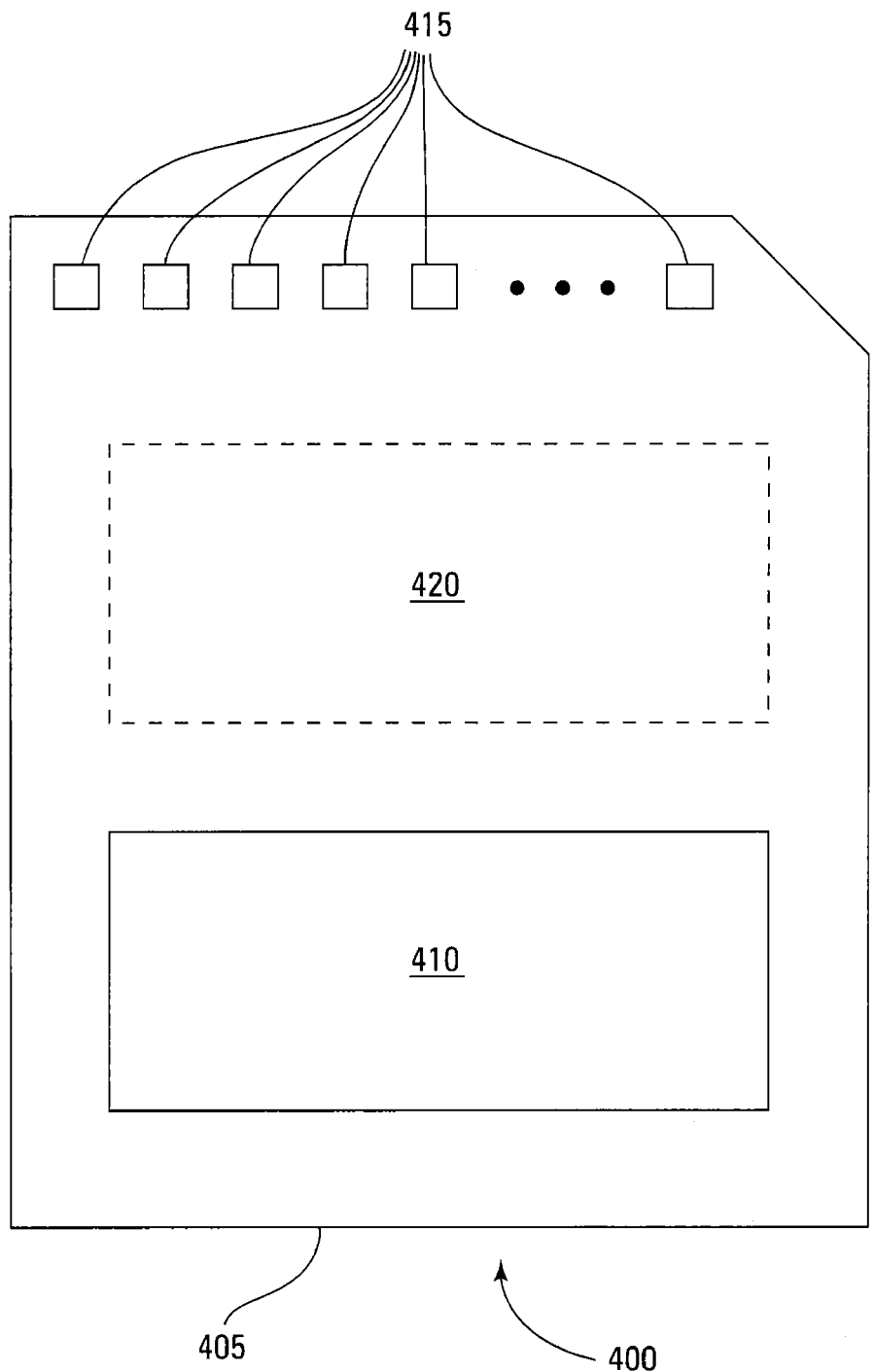
FIG. 4 is an illustration of an exemplary memory module, according to another embodiment of the invention.

FIG. 4 is an illustration of an exemplary memory module 400. Memory module 400 is illustrated as a memory card, although the concepts discussed with reference to memory module 400 are applicable to other types of removable or portable memory, e.g., USB flash drives, and are intended to be within the scope of "memory module" as used herein. In addition, although one example form factor is depicted in FIG. 4, these concepts are applicable to other form factors as well.

In some embodiments, memory module 400 will include a housing 405 (as depicted) to enclose one or more memory devices 410, though such a housing is not essential to all devices or device applications. At least one memory device 410 may be a NAND, NOR, or NROM flash memory device, dynamic random access memory device (DRAMs), static random access memory device (SRAMs), or the like having a memory array formed in accordance with the methods of the invention. Where present, the housing 405 includes one or more contacts 415 for communication with a host device. Examples of host devices include digital cameras, digital recording and playback devices, PDAs, personal computers, memory card readers, interface hubs and the like. For some embodiments, the contacts 415 are in the form of a standardized interface. For example, with a USB flash drive, the contacts 415 might be in the form of a USB Type-A male connector. For some embodiments, the contacts 415 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 415 provide an interface for passing control, address and/or data signals between the memory module 400 and a host having compatible receptors for the contacts 415.

The memory module 400 may optionally include additional circuitry 420 which may be one or more integrated circuits and/or discrete components. For some embodiments, the additional circuitry 420 may include a memory controller for controlling access across multiple memory devices 410 and/or for providing a translation layer between an external host and a memory device 410. For example, there may not be a one-to-one correspondence between the number of contacts 415 and a number of I/O connections to the one or more memory devices 410. Thus, a memory controller could selectively couple an I/O connection (not shown in FIG. 4) of a memory device 410 to receive the appropriate signal at the appropriate I/O connection at the appropriate time or to provide the appropriate signal at the appropriate contact 415 at the appropriate time. Similarly, the communication protocol between a host and the memory module 400 may be different than what is required for access of a memory device 410. A memory controller could then translate the command sequences received from a host into the appropriate command sequences to achieve the desired access to the memory device 410. Such translation may further include changes in signal voltage levels in addition to command sequences.

The additional circuitry 420 may further include functionality unrelated to control of a memory device 410 such as logic functions as might be performed by an ASIC (application specific integrated circuit). Also, the additional circuitry 420 may include circuitry to restrict read or write access to the memory module 400, such as password protection, biometrics or the like. The additional circuitry 420 may include circuitry to indicate a status of the memory module 400. For example, the additional circuitry 420 may include functionality to determine whether power is being supplied to the memory module 400 and whether the memory module 400 is currently being accessed, and to display an indication of its status, such as a solid light while powered and a flashing light while being accessed. The additional circuitry 420 may further include passive devices, such as decoupling capacitors to help regulate power requirements within the memory module 400.

Figure 5A:
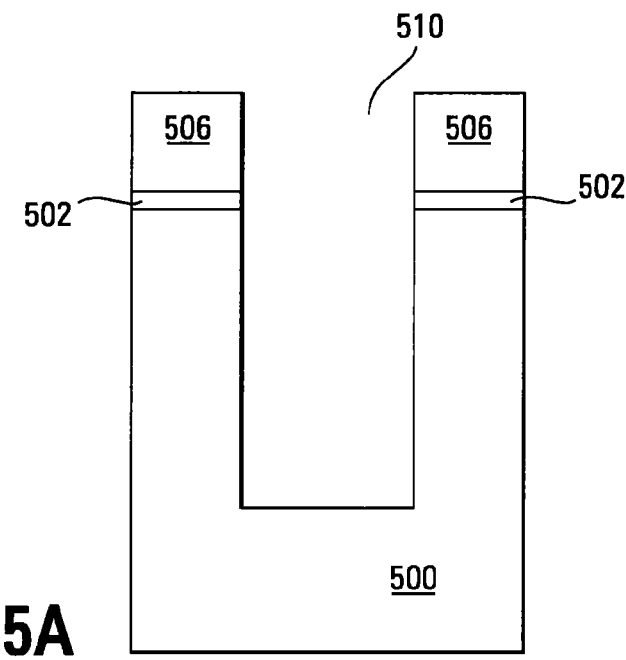
FIGS. 5A-5J are cross-sectional views of a portion of a row of a memory array during various stages of fabrication, according to another embodiment of the invention.

FIGS. 5A-5J are cross-sectional views of a portion of a row of a memory array, such as a portion of a row of memory array 104 of FIG. 1, memory array 200 of FIG. 2, memory array 300 of FIG. 3, a memory array of memory device 410 of FIG. 4, or the like, during various stages of fabrication, according to another embodiment of the invention. FIG. 5A depicts the portion of the memory device after several processing steps have occurred. Formation of the structure depicted in FIG. 5A is well known and will not be detailed herein.

In general, for one embodiment, the structure of FIG. 5A is formed by forming a dielectric layer 502, e.g., an oxide layer, on a semiconductor substrate 500, such as a silicon-containing substrate, e.g., a monocrystalline silicon substrate, a P-type monocrystalline silicon substrate, etc. Dielectric layer 502 may be blanket deposited or thermally grown on substrate 500 for one embodiment. A dielectric layer 506, such as a nitride layer, e.g., a silicon nitride ($Si_3N_4$) layer, is formed on dielectric layer 502. For one embodiment, dielectric layer 502 is a pad oxide layer that acts as a stress buffer between dielectric layer 506 and substrate 500.

A mask layer (not shown), e.g., an imaging resist layer, such as a layer of photo resist, is formed overlying dielectric layer 506 and is patterned to define areas of dielectric layers 502 and 506 and of substrate 500 for removal. The areas of dielectric layers 502 and 506 and of substrate 500 defined for removal are subsequently removed, e.g., by etching, to form a trench 510 that exposes a portion of substrate 500.

Figure 5B:
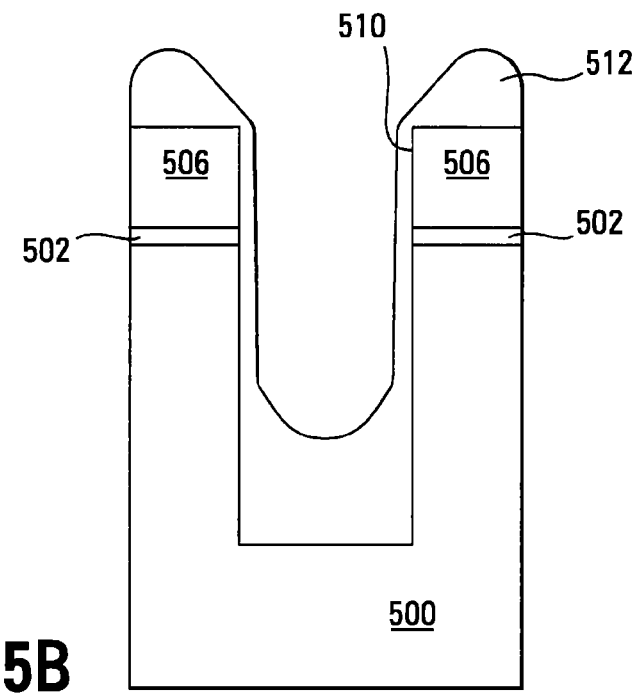

In FIG. 5B a dielectric layer 512 is formed overlying the structure of FIG. 5A so as to partially fill trench 510. That is, dielectric layer 512 is formed adjoining an upper surface of dielectric layer 506 and adjoining the exposed portion of substrate 500 within trench 510 so as to line sidewalls of trench 510 and to fill a lower portion of trench 510 above a bottom portion of trench 510. For one embodiment, dielectric layer 512 is a high-density plasma dielectric, such as a high-density plasma oxide, e.g., silicon dioxide, deposited using a high-density plasma (HDP) process. In another embodiment, dielectric layer 512 may be oxide deposited with a TEOS- (tetraethylorthosilicate-) based process. For other embodiments, formation of dielectric layer 512 is stopped prior to the formation of any voids. For another embodiment, dielectric layer 512 defines a container-shaped structure within trench 510, as shown in FIG. 5B.

Figure 5C:
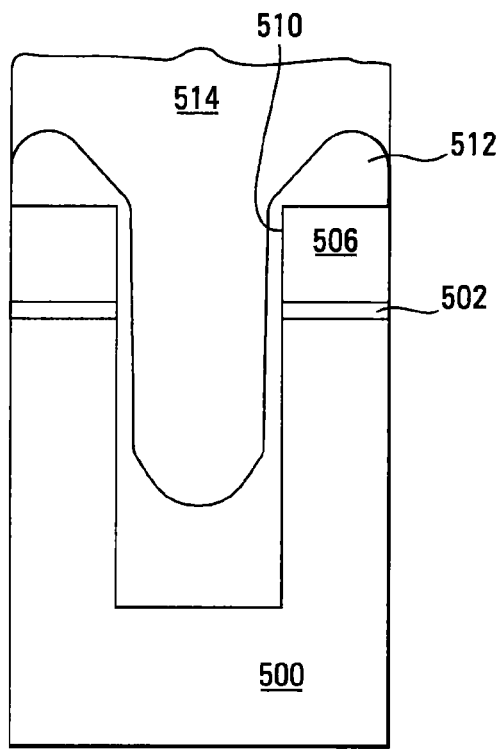
Figure 5D:
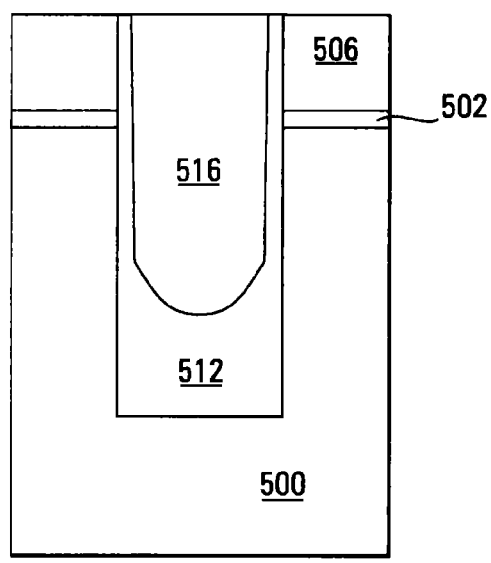

In FIG. 5C, a dielectric layer 514, e.g., a layer of spin-on dielectric (SOD) material, such as a spin-on glass, hydrogen silsesquioxane (HSQ), hexamethyldisiloxane, polysilazane, octamethyltrisiloxane, etc., is formed overlying dielectric layer 512 and overfills trench 510. Dielectric layer 514 is then cured (or annealed), e.g., using a steam-densification process, e.g., steam-oxidation process. A steam densification/oxidation process typically removes unwanted chemical groups and converts materials exposed thereto into silicon dioxide. Reference number 516 is used in subsequent figures to denote the dielectric layer produced by the densification process. For one embodiment, the steam-densification process is carried out to a level such that dielectric layer 516 can survive a subsequent chemical mechanical planerization (CMP) process, as shown in FIG. 5D. For another embodiment, densification may be carried out at about 600° C. for about one hour. However, the steam-densification process may be carried out for a slightly longer time at a slightly lower temperature or a slightly shorter time at a slightly higher temperature. The steam-densification process condition should densify the structure sufficiently without over oxidizing exposed silicon. For some embodiments, dielectric layer 512 and dielectric layer 516 have substantially similar chemical compositions, such as a silicon oxide, e.g., silicon dioxide, but dielectric layer 512 has a lower wet-etch rate than dielectric layer 516 and a lower bond-site density.

Figure 5E:
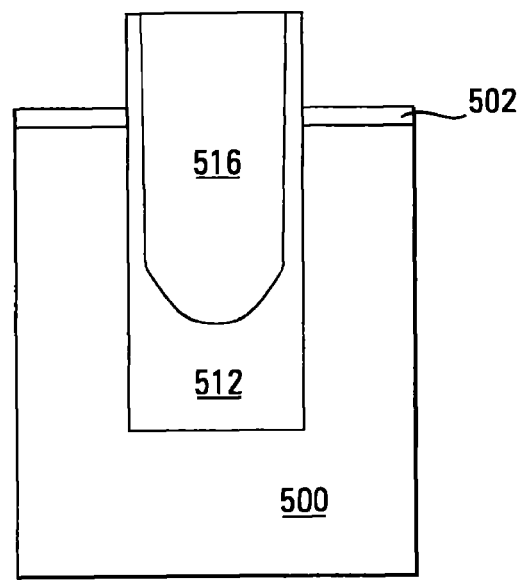

In FIG. 5D, portions of dielectric layer 516 and dielectric 512 that overlie an upper surface of dielectric layer 506 are removed, e.g., by chemical mechanical planerization (CMP). Subsequently, dielectric layer 506 is removed, such as by etching, in FIG. 5E. For one embodiment, a dry etch etches away dielectric layer 506. In another embodiment, dry etching of dielectric layer 506 includes using sulfur hexafluoride ($SF_6$) and Hydrogen Bromide (HBr). Using a dry etch instead of a wet etch prevents unwanted excessive or complete removal of the dielectric layer 516. Note that dielectric layer 516 forms a plug-like structure that is contained in the container-shaped structure defined by dielectic layer 512, as shown in FIG. 5E.

Figure 5F:
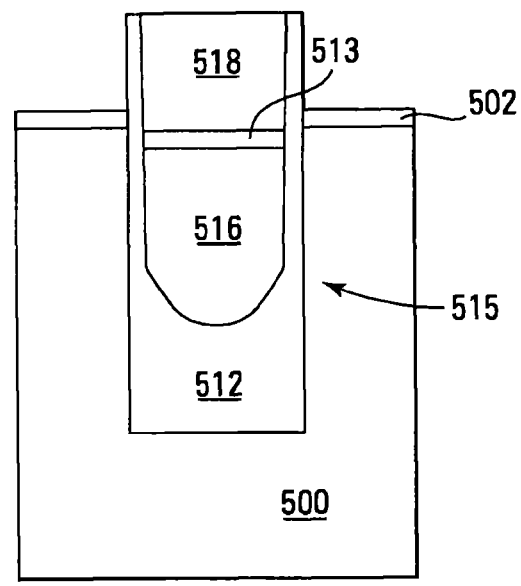

In FIG. 5F, a portion of dielectric layer 516 (or the plug-like structure), primarily located above dielectric layer 502, but extending below dielectric layer 502, is subjected to a densification process, e.g., a nitrogen anneal process. For one embodiment, the anneal/densification process is carried out at about 900° C. for about one half hour in an inert environment, e.g., in a nitrogen environment. The portion subjected to the anneal/densification process is denoted by reference number 518 to distinguish that although dielectric layers 516 and 518 have substantially similar chemical compositions, such as a silicon oxide, e.g., silicon dioxide, dielectric layer 518 has a higher density and a lower etch rate than dielectric layer 516 due to more effective densification without the constraints of the surrounding materials. Note that for one embodiment, dielectric layer 518 and dielectric layer 512 may have substantially similar chemical compositions, such as a silicon oxide, e.g., silicon dioxide. For another embodiment, dielectric layer 518 and dielectric layer 512 have substantially the same etch rates.

As a portion of dielectric layer 516 exceeds the reach of the anneal/densification, a transition region 513, where the bonding-structure density and etch rate transition from those of dielectric layer 518 to those of dielectric layer 516, may occur. Dielectric layers 512, 518, and 516 form an isolation region 515.

Figure 5G:
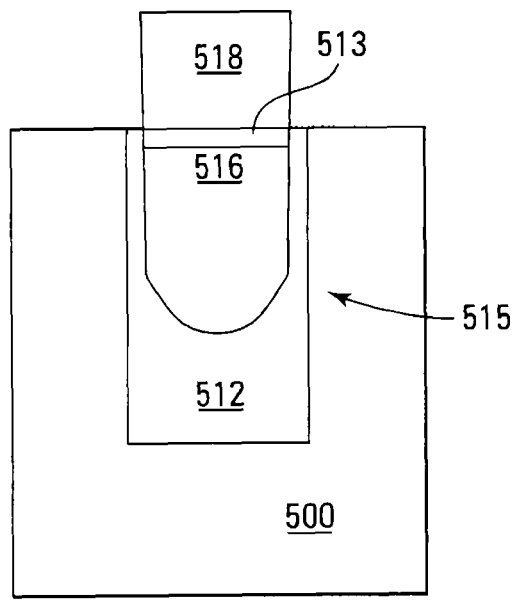
Figure 5H:
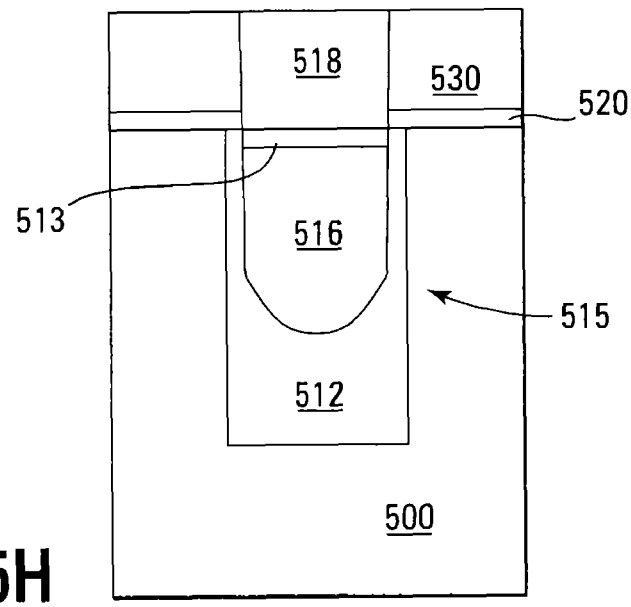

In FIG. 5G, dielectric layer 502 is removed, e.g., by a wet etch, thereby exposing portions of substrate 500 that correspond to active regions of substrate 500 over which memory cells will be formed. Note that during the removal of dielectric layer 502 exposed portions of dielectric layers 512 and 518 may also be removed. Subsequently, a dielectric layer 520, e.g., a tunnel dielectric layer of the future memory cells, such as a tunnel oxide layer, is formed on the exposed portions of substrate 500, in FIG. 5H. For one embodiment, dielectric layer 520 is thermally grown on substrate 500. A conductive layer 530, e.g., a layer of doped polysilicon, is formed overlying dielectric layer 520 and dielectric layers 512 and 518, in FIG. 5H, and, for one embodiment, forms a portion of a floating gate layer of the future memory cells. Portions of conductive layer 530 are subsequently removed, e.g., by CMP, in FIG. 5H.

Figure 5I:
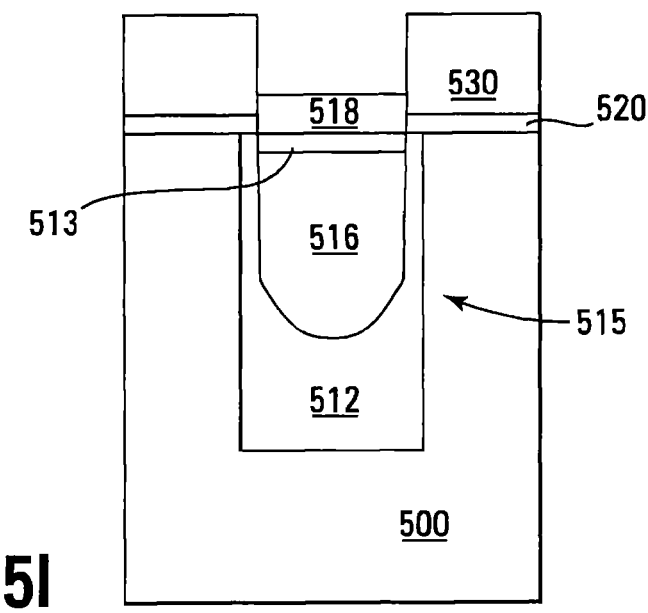
Figure 5J:
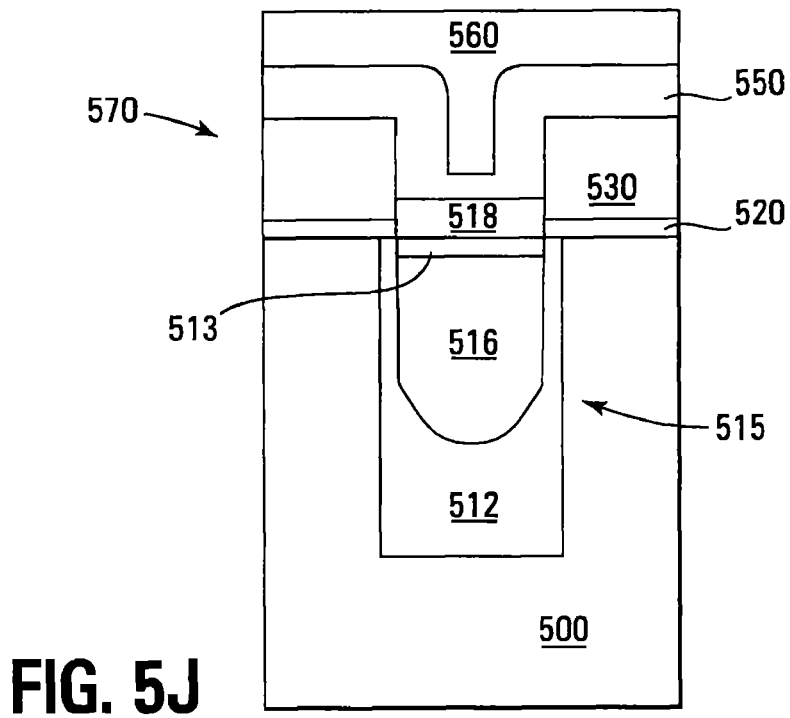

In FIG. 5I, a portion of isolation region 515, e.g., dielectric layer 518 is removed, such as by etching in an etch-back process, so that an upper surface of isolation region 515 is recessed below an upper surface of conductive layer 530. A dielectric layer 550 is formed on conductive layer 530 and the exposed upper surface of isolation region 515, as shown in FIG. 5J, and, for one embodiment, forms an interlayer dielectric layer of the future memory cells. For another embodiment, dielectric layer 550 may be one or more layers of dielectric material. For example, dielectric layer 550 could be of a multi-layer dielectric material commonly referred to as ONO (oxide-nitride-oxide). Other dielectric materials may be substituted for the ONO, such as tantalum oxide, barium strontium titanate, silicon nitride, and other materials providing dielectric properties.

A conductive layer 560 is formed overlying dielectric layer 550, as shown in FIG. 5J, and forms, for one embodiment, a control gate layer (or word line) of memory cells 570, e.g., floating-gate memory cells (or floating-gate transistors). Conductive layer 560 is generally one or more layers of conductive material. For one embodiment, conductive layer 560 contains a conductively-doped polysilicon. For a further embodiment, conductive layer 560 includes a metal-containing layer overlying a polysilicon layer, e.g., a refractory metal silicide layer formed on a conductively-doped polysilicon layer. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals. For another embodiment, conductive layer 560 contains multiple metal-containing layers, e.g., a titanium nitride (TiN) barrier layer overlying dielectric layer 550, a titanium (Ti) adhesion layer overlying the barrier layer, and a tungsten (W) layer overlying the adhesion layer. An insulative cap layer (not shown) is often formed overlying conductive layer 560 to protect and isolate conductive layer 560 from further processing.

Note that dielectric layer 512 (FIG. 5J) defines a container-like structure that contains a portion of a dielectric-plug structure formed from dielectric layers 516 and 518 and transition region 513. Note further that in one embodiment, another portion of the dielectric-plug structure, e.g., a portion of dielectric layer 518, extends above an upper surface of substrate 500 between dielectric layer 520 and at least a portion of conductive layer 530.

It is noted that FIGS. 5A-5J depict a portion of a row of memory cells, such as a row 202 of FIG. 2 or a row 302 of FIG. 3, running parallel to a face plane of the drawings. Columns of memory cells, separated by the isolation regions 515, run perpendicular to the drawings, with source and drain regions formed at opposing ends of dielectric layer 520, one above the face plane of the figures and one below the face plane of the figures. Isolation regions 515 act to electrically isolate memory cells of adjacent columns from each other. It is noted that FIGS. 5A-5J can depict either a NOR-type memory device or a NAND-type memory device, with the differences occurring in the column direction in manners that are well understood in the art of memory fabrication.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory array, comprising:
   a substrate;
   a plurality of intersecting rows and columns formed on the substrate, each intersection of a row and column defining a memory cell; and
   an isolation region disposed between adjacent columns of memory cells, wherein the isolation region comprises:
      a layer of high-density plasma dielectric material formed within the substrate and adjoining the substrate; and
      a second layer of dielectric material having a first portion within the substrate and adjoining the layer of high-density plasma dielectric material and a second portion extending above an upper surface of the substrate between the memory cells of adjacent columns, wherein at least a portion of the first portion of the second layer of dielectric material has a lower densification level than the second portion of the second layer of dielectric material.

2. The memory array of claim 1, wherein the high-density plasma dielectric material is a high-density plasma oxide.

3. The memory array of claim 1, wherein the second portion of the second layer of dielectric material extends between floating gates of the memory cells of the adjacent columns.

4. The memory array of claim 3, wherein an upper surface of the second portion of the second layer of dielectric material extending between floating gates of the memory cells of the adjacent columns is at a depth lower than upper surfaces of the floating gates of the memory cells of the adjacent columns.

5. The memory array of claim 4, further comprising a dielectric over and adjoining the upper surface of the second portion of the second layer of dielectric material and the upper surfaces of the floating gates of the memory cells of the adjacent columns.

6. The memory array of claim 5, further comprising a conductor over the dielectric.

7. The memory array of claim 6, wherein a portion of the conductor is located between the floating gates of the memory cells of the adjacent columns.

8. The memory array of claim 7, wherein the conductor forms a control gate of the memory cells of the adjacent columns.

9. A memory array, comprising:
   a substrate;
   a plurality of intersecting rows and columns formed on the substrate, each intersection of a row and column defining a memory cell; and
   an isolation region disposed between adjacent columns of memory cells, wherein the isolation region comprises:
      a layer of high-density plasma dielectric material formed within the substrate and adjoining the substrate; and
      a second layer of dielectric material having a first portion within the substrate and adjoining the layer of high-density plasma dielectric material and a second portion extending above an upper surface of the substrate between the memory cells of adjacent columns, wherein at least a portion of the first portion of the second layer of dielectric material has a lower densification level than the second portion of the second layer of dielectric material;
wherein ends of the layer of high-density plasma dielectric material extend to a level of the upper surface of the substrate.

10. The memory array of claim 9, wherein the level of the upper surface of the substrate to which the ends of the layer of high-density plasma dielectric material extend is above an upper surface of the first portion of the second layer of dielectric material.

11. The memory array of claim 1, wherein each memory cell is a floating-gate memory cell.

12. The memory array of claim 1, wherein each memory cell is a flash memory cell.

13. A memory array, comprising:
a substrate;
a plurality of intersecting rows and columns formed on the substrate, each intersection of a row and column defining a non-volatile memory cell; and
an isolation region disposed between adjacent columns of non-volatile memory cells, wherein the isolation region comprises:
a layer of high-density plasma oxide formed within the substrate and adjoining the substrate; and
a layer of densified spin-on dielectric material having a first portion within the substrate and adjoining the layer of high-density plasma oxide and a second portion extending above an upper surface of the substrate between the memory cells of adjacent columns, wherein at least a portion of the first portion of the densified spin-on dielectric material has a lower densification level than the second portion of the densified spin-on dielectric material.

14. A memory module, comprising:
a plurality of contacts; and
two or more memory devices, each having access lines selectively coupled to the plurality of contacts;
wherein at least one of the memory devices comprises a memory array, comprising:
a plurality of intersecting rows and columns formed on a substrate, each intersection of a row and column defining a memory cell; and
an isolation region disposed between adjacent columns of memory cells, wherein the isolation region comprises:
a layer of high-density plasma dielectric material formed within the substrate and adjoining the substrate; and
a second layer of dielectric material having a first portion within the substrate and adjoining the layer of high-density plasma dielectric material and a second portion extending above an upper surface of the substrate between the memory cells of adjacent columns, wherein at least a portion of the first portion of the second layer of dielectric material has a lower densification level than the second portion of the second layer of dielectric material.

15. The memory module of claim 14, wherein the memory cells are non-volatile memory cells.

16. The memory module of claim 14, wherein the high-density plasma dielectric material is a high-density plasma oxide.

17. A memory module, comprising:
a plurality of contacts; and
two or more memory devices, each having access lines selectively coupled to the plurality of contacts;
wherein at least one of the memory devices comprises a memory array, comprising:
a plurality of intersecting rows and columns formed on a substrate, each intersection of a row and column defining a non-volatile memory cell; and
an isolation region disposed between adjacent columns of memory cells, wherein the isolation region comprises:
a layer of high-density plasma oxide formed within the substrate and adjoining the substrate; and
a layer of densified spin-on dielectric material having a first portion within the substrate and adjoining the layer of high-density plasma dielectric material and a second portion extending above an upper surface of the substrate between the memory cells of adjacent columns, wherein at least a portion of the first portion of the densified spin-on dielectric material has a lower densification level than the second portion of the densified spin-on dielectric material.

18. A memory module, comprising:
a housing having a plurality of contacts; and
one or more memory devices enclosed in the housing and selectively coupled to the plurality of contacts;
wherein at least one of the memory devices comprises a memory array, comprising:
a plurality of intersecting rows and columns formed on a substrate, each intersection of a row and column defining a memory cell; and
an isolation region disposed between adjacent columns of memory cells, wherein the isolation region comprises:
a layer of high-density plasma dielectric material formed within the substrate and adjoining the substrate; and
a second layer of dielectric material having a first portion within the substrate and adjoining the layer of high-density plasma dielectric material and a second portion extending above an upper surface of the substrate between the memory cells of adjacent columns, wherein at least a portion of the first portion of the second layer of dielectric material has a lower densification level than the second portion of the second layer of dielectric material.

19. A memory module, comprising:
a housing having a plurality of contacts; and
one or more memory devices enclosed in the housing and selectively coupled to the plurality of contacts;
wherein at least one of the memory devices comprises a memory array, comprising:
a plurality of intersecting rows and columns formed on a substrate, each intersection of a row and column defining a non-volatile memory cell; and
an isolation region disposed between adjacent columns of memory cells, wherein the isolation region comprises:
a layer of high-density plasma oxide formed within the substrate and adjoining the substrate; and
a layer of densified spin-on dielectric material having a first portion within the substrate and adjoining the layer of high-density plasma dielectric material and a second portion extending above an upper surface of the substrate between the memory cells of adjacent columns, wherein at least a portion of the first portion of the oxidized spin-on dielectric material has a lower densification level than the second portion of the densified spin-on dielectric material.

20. An electronic system, comprising:
a processor; and
one or more memory devices coupled to the processor, wherein at least one of the memory devices comprises a memory array, comprising:
 a plurality of intersecting rows and columns formed on a substrate, each intersection of a row and column defining a memory cell; and
 an isolation region disposed between adjacent columns of memory cells, wherein the isolation region comprises:
  a layer of high-density plasma dielectric material formed within the substrate and adjoining the substrate; and
  a second layer of dielectric material having a first portion within the substrate and adjoining the layer of high-density plasma dielectric material and a second portion extending above an upper surface of the substrate between the memory cells of adjacent columns, wherein at least a portion of the first portion of the second layer of dielectric material has a lower densification level than the second portion of the second layer of dielectric material.

21. The electronic system of claim 20, wherein the memory cells are non-volatile memory cells.

22. The electronic system of claim 20, wherein the high-density plasma dielectric material is a high-density plasma oxide.

23. An electronic system, comprising:
a processor; and
one or more memory devices coupled to the processor, wherein at least one of the memory devices comprises a memory array, comprising:
 a plurality of intersecting rows and columns formed on a substrate, each intersection of a row and column defining a non-volatile memory cell; and
 an isolation region disposed between adjacent columns of memory cells, wherein the isolation region comprises:
  a layer of high-density plasma oxide formed within the substrate and adjoining the substrate; and
  a layer of densified spin-on dielectric material having a first portion within the substrate and adjoining the layer of high-density plasma dielectric material and a second portion extending above an upper surface of the substrate between the memory cells of adjacent columns, wherein at least a portion of the first portion of the densified spin-on dielectric material has a lower densification level than the second portion of the densified spin-on dielectric material.

* * * * *